United States Patent [19]

Pomper et al.

[11] 3,950,778

[45] Apr. 13, 1976

[54] SEMICONDUCTOR DEVICE AND CASE MEMBER

[75] Inventors: Edward G. Pomper; Raymond J. Koval, both of Greensburg, Pa.

[73] Assignee: Westinghouse Electric Corporation, Pittsburgh, Pa.

[22] Filed: Sept. 30, 1974

[21] Appl. No.: 510,822

[52] U.S. Cl. .................... 357/74; 357/79; 357/81
[51] Int. Cl.² ................. H01L 23/02; H01L 23/42
[58] Field of Search ....................... 357/74, 81, 79

[56] References Cited
UNITED STATES PATENTS
3,483,439  12/1969  Kosco ............................... 357/81

Primary Examiner—Stanley D. Miller, Jr.
Assistant Examiner—E. Wojciechowicz
Attorney, Agent, or Firm—C. L. Menzemer

[57] ABSTRACT

An improved case member for a power semiconductor device is comprised of compacted powdered iron infiltrated with copper to provide good electrical and thermal contact for the semiconductor element and sufficient mechanical strength for use in a compression bonded encapsulation.

4 Claims, 4 Drawing Figures

PRIOR ART

SEMICONDUCTOR DEVICE AND CASE MEMBER

BACKGROUND OF THE INVENTION

1. Field of the Invention

The present invention relates to a case member for power semiconductor devices, such as rectifiers, thyristors and transistors.

2. Description of the Prior Art

Stud type compression bonded power semiconductor devices of the prior art use high electrical and thermal conductivity metals, as for example, copper, for electrical and thermal contact members of the device, while using higher strength metals, as for example, steel, for the compression members of the device.

The superior electrical and thermal properties of copper are preferred for the metal contact members to obtain optimum performance of a power semiconductor device. Since compression bonding requires a high yield strength material such as steel for compression members, optimum performance devices of the prior art use both copper and steel components to form at least part of the device.

SUMMARY OF THE INVENTION

The present invention comprises an improved case member formed by powdered metallurgy for use in a power semiconductor device, and, in particular, for compression bonded devices. The case member exhibits the advantages of copper and iron in a single structure of compacted powdered iron infiltrated with copper, in which the copper content is a fractional portion of the whole.

DESCRIPTION OF THE PREFERRED EMBODIMENTS

Figure 1:
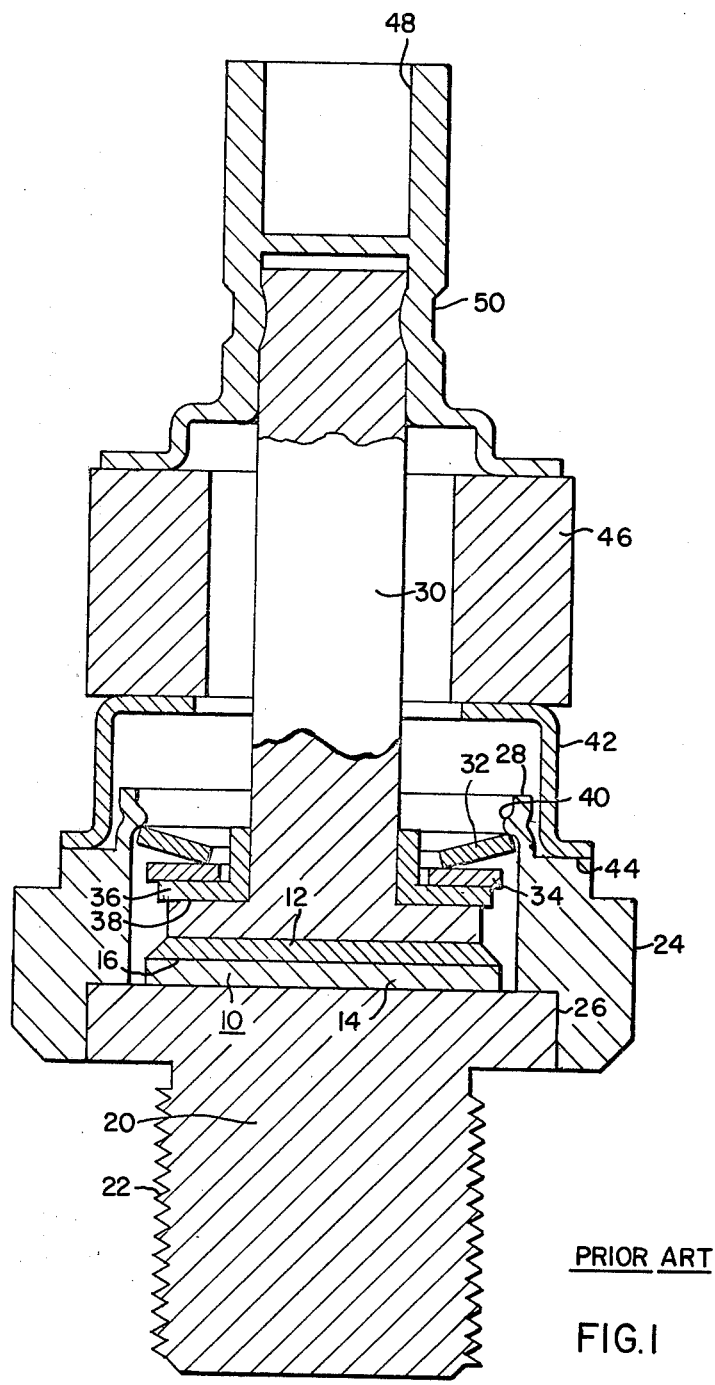
FIG. 1 is a vertical cross sectional view of a compression bonded semiconductor device of the prior art.

FIG. 1 illustrates a compression bonded semiconductor device of the prior art with respect to which the present invention is an improvement. The device comprises a semiconductor element 10 having a semiconductor wafer 12, for example silicon, appropriately doped to provide at least one pn junction therein. The semiconductor wafer 12 is joined to a metal contact disk 14 by means of a layer 16 of suitable solder or brazing composition. The metal disk 14 has both good electrical and thermal conductivity as well as a thermal expansion compatible with the semiconductor wafer 12, for example the thermal expansion of a molybdenum disk is compatible with that of a silicon wafer. Tungsten and tantalum are also examples of suitable materials for the metal disk 14.

The semiconductor element 10 is encapsulated by means of a compression bonding technique, as described for example, in U.S. Pat. No. 3,683,492. Good mechanical and electrical contact is made to the opposite sides of the semiconductor element 10 by means of a mounting contact member 20 and an upper contact member 30. The mounting member 20 has a threaded stud portion 22 providing one external electrical and heat dissipating connection to the semiconductor device. The mounting member 20 and a housing member 24 are machined to provide a precise fit and are hermetically joined by means of a soldering or brazing at their common interface 26. The housing member 24 has a staking wall 28, generally cylindrical in shape, and extending upwardly from the mounting member 20. The upper contact member 30 is held in compressive force against the semiconductor element 10 by means of a belleville spring washer 32 which transmits the compressive force through a metal thrust washer 34 and an insulating sleeve 36 to a peripheral shelf 38 of the member 30. The belleville spring washer 32 is held in a state of compression by means of protrusions or staking deformations 40 in the tubular staking wall 28 in a manner more fully described in U.S. Pat. No. 3,683,492. A flange 42 is hermetically sealed to the housing member 24 by means of welding or the like at interface 44. The flange 42 is joined as by soldering or brazing to a generally cylindrical shaped ceramic insulator 46, which in turn is similarly joined to a top external contact 48. Good electrical contact between the top external contact 48 and the internal lead 30 is achieved by a swaging 50.

The device of the prior art illustrated in FIG. 1, uses copper for the mounting member 20 primarily to minimize the thermal impedance in conducting heat from the semiconductor element 10 through the mounting member 20 to a heat sink or the like. Furthermore, the compression bonded design of FIG. 1 requires a high yield strength material for the housing member 24 in order to maintain the compressive force exerted by the spring washer 32 against the wall 28 of the housing member 24. The force applied typically ranges from 500 to 3000 pounds, depending on the size of the compression bonded device. Similarly, the thickness of the tubular staking wall 28 typically ranges from 30 to 60 mils. The wall 28 must be thin enough to permit the protrusions 40 to be formed, yet thick enough to hold the compressive force exerted by the spring washer 32. If the housing member 24 were made of copper, for example, the staking wall 28 would yield at the protrusions 40 due to the relatively low yield strength of copper and the high force exerted by the spring washer 32, resulting in eventual loss of the compressive force which in turn would cause overheating of the semiconductor element 10 and, ultimately, device failure. Such design considerations require the employment of a ferrous material or other high yield strength material for the housing member 24 of a compression bonded device.

Lower cost devices have been manufactured in which the housing member 24 and the mounting member 20 are a single steel structure, however, such devices have a significantly reduced electrical power rating, since the thermal conductivity of steel is inferior to that of copper. Consequently, high performance devices of the prior art necessarily use the relatively expensive two part structure of FIG. 1 in which the mounting member 20 comprises copper and the housing member 24 comprises steel, and both members are precisely machined and hermetically joined into a single unit.

The present invention discloses a novel combination of the mounting member 20 and the housing member 24 in a single structure of a common material composition having both the high thermal performance of copper and the high strength properties of steel. Briefly, the entire composite 20–24, replacing that of FIG. 1, is prepared from powdered ferrous metal, preferably a carbon steel base material, which is compressed into a compact roughly of the desired shape, and then sintered at an elevated temperature while in contact with a disk of copper, which copper melts and impregnates the pores of the compact to provide a ferrous member of high strength and with sufficient copper to insure good thermal and electrical conductivity.

Figure 2:
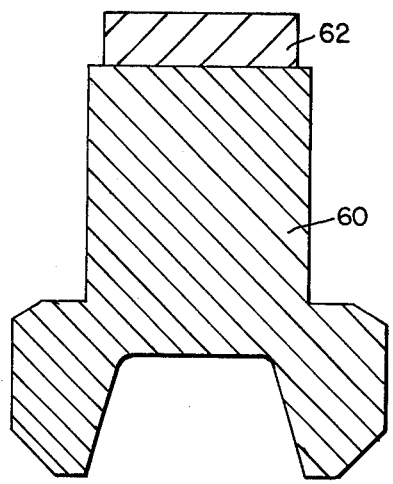
FIG. 2 is a vertical cross sectional view of an assembly of a compact of compressed powdered iron and a copper disk.

FIG. 2 illustrates a compact 60 of powdered iron and a copper disk 62 resting atop the compact 60. The compact 60 is formed by compacting powdered iron, containing a small amount of powdered graphite, in a die under high pressure in a manner known to the art of powder metallurgy. When brought to a sufficiently high temperature in a sintering furnace the copper disk 62 melts and flows down into the porous iron matrix of the compact 60, infiltrating the powdered iron with copper. Wetability of the copper infiltrant may be improved by adding a small amount of powdered copper or nickel to the powdered iron compact 60. When cooled the result is a high density structure having the shape of the original compact 60, which is shown in its upright position in FIG. 3.

Figure 3:
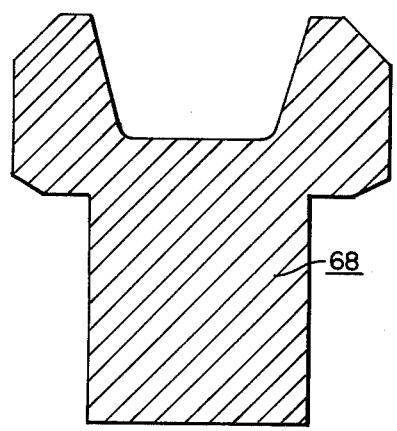
FIG. 3 is a vertical cross sectional view of an infiltrated premachined case member; and, FIG. 4 is a vertical cross sectional view of a machined and threaded case member of a device of this invention.

The infiltrated premachined case member 68 of FIG. 3 preferably has a nominal composition by weight of 69 to 85 percent iron, 15 to 25 percent copper, from 0.10 to about 0.25 percent carbon, with small amounts of other additives, as for example nickel and manganese, and incidental impurities, as for example, silicon, sulfur and oxygen. Typical mechanical properties of the member 68 are: minimum tensile strength = 65,000 psi, minimum yield strength = 70,000 psi, density = 7.1 to 7.6 gr/cc and elongation about 1 percent.

Figure 4:
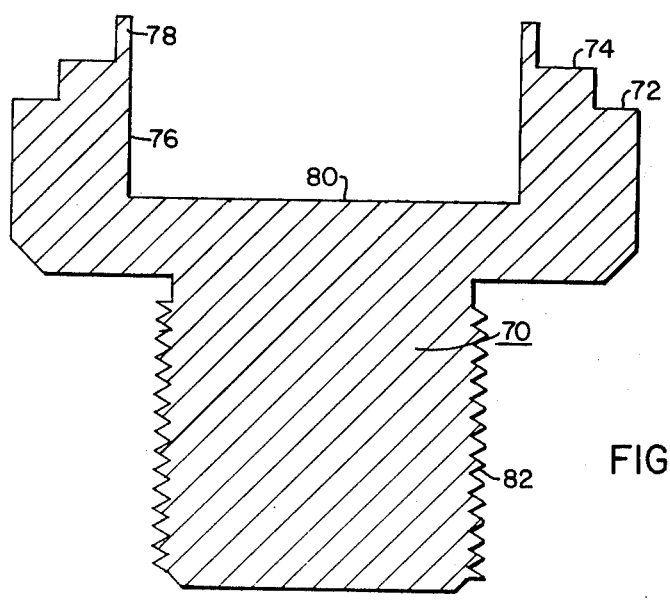

FIG. 4 illustrates a machined case member 70 formed from the copper infiltrated-powdered iron, high density structure of FIG. 3. The case member 70 is formed by machining flat cylindrical shelves 72 and 74 in the wall of the case member 70 and machining a cylindrical well 76 to provide a tubular staking wall 78 and a flat mounting surface 80. The stud 82 is threaded to provide a means for contacting and mounting. The case member 70 is then usually electroplated with copper and nickel to prevent corrosion and provide a good thermal transfer surface, as well as for appearance.

As is apparent from a comparison of FIGS. 4 and 1, the invention provides the case member 70 as a direct replacement for the brazed composite of the mounting member 20 and the housing member 24. It is no longer necessary to braze the copper mounting member 20 to the steel housing member 24, since the single structure case member 70 exhibits both electrical and thermal properties approaching copper and the high strength properties of steel necessary to perform the aforementioned functions. There are a number of additional advantages associated with the use of powder metallurgy, examples of which are, easy machinability of the case member 70 with a minimum of waste metal, and good plating and welding properties.

Tests were performed on a prototype semiconductor rectifier device of the basic copper infiltrated-powdered iron construction disclosed herein. Forward voltage drop, power, surge and thermal impedance measurements fell within the acceptable range of the specifications for high performance devices of the prior art.

Although the high strength properties of the powdered ferrous material are an important feature of the present invention, application of powdered metallurgy is not limited to parts which require high strength. The upper contact member 30 of FIG. 1, is an ideal example of a copper part which may be replaced by a copper infiltrated powdered iron part, taking advantage of the good electrical and thermal properties of copper at a reduced cost. Similarly, powdered metallurgy is not limited to housing and mounting members of the compression bonded embodiment of FIG. 1; but rather, the invention has applicability to other power semiconductor embodiments.

From the foregoing description, taken with the drawings it is seen that this invention provides a novel and effective technique for replacing a mounting and a housing member of the prior art with a single case member having the unique properties of both of the replaced members.

What is claimed is:
1. A semiconductor device comprising
   a. a semiconductor element, said semiconductor element comprising a wafer of semiconductor material and at least one electrical contact affixed to a major surface of the wafer, said wafer having at least one pn junction therein;
   b. a case member, said case member having a composition by weight of 69 to 85 percent iron, 15 to 25 percent copper, and 0.10 to 0.25 percent carbon, said case member being in electrical and thermal contact with a first major surface of the semiconductor element;
   c. an upper contact member pressing upon and making electrical and thermal contact to a second major surface of the semiconductor element; and,
   d. compression means retained by a portion of the case member and acting upon the upper contact member so as to apply a predetermined force to the semiconductor element.

2. A semiconductor device as set forth in claim 1 wherein the compression means comprises a spring member held in compression by protrusions in a thin tubular wall of the case member.

3. A semiconductor device as set forth in claim 1 wherein the case member has a minimum yield strength of about 70,000 psi.

4. A case member for use in a semiconductor device, said case member comprising compacted and sintered powdered iron infiltrated with copper to achieve a minimum yield strength about 70,000 psi, said case member having a lower generally cylindrically shaped stud portion and an upper generally cup-shaped portion, said cup-shaped portion having a substantially flat mounting surface disposed above the stud portion and a thin tubular wall extending upwardly away from the stud portion, said thin tubular wall having a thickness of about 30 to about 60 mils.

* * * * *